US008155351B2

(12) United States Patent
Hayashida

(10) Patent No.: US 8,155,351 B2

(45) Date of Patent: Apr. 10, 2012

(54) SOUND SIGNAL OUTPUT DEVICE AND PROGRAM FOR CONTROLLING SOUND OUTPUT

(75) Inventor: Atsushi Hayashida, Kariya (JP)

(73) Assignee: Denso Corporation, Kariya (JP)

( * ) Notice: Subject to any disclaimer, the term of this patent is extended or adjusted under 35 U.S.C. 154(b) by 1610 days.

(21) Appl. No.: 11/332,363

(22) Filed: Jan. 17, 2006

(65) Prior Publication Data

US 2006/0161279 A1 Jul. 20, 2006

(30) Foreign Application Priority Data

Jan. 20, 2005 (JP) ................................ 2005-012902

(51) Int. Cl.
*H03F 99/00* (2009.01)

(52) U.S. Cl. .............................. 381/120; 700/94; 330/2

(58) Field of Classification Search .............. 381/55-56, 381/58-59, 77-85, 104-109, 120, 123; 700/94; 330/2

See application file for complete search history.

(56) References Cited

U.S. PATENT DOCUMENTS

| | | | | |
|---|---|---|---|---|
| 4,176,251 | A * | 11/1979 | Odlen et al. | 381/59 |
| 6,381,312 | B1 * | 4/2002 | Hayashi | 379/93.37 |
| 2005/0250462 | A1 * | 11/2005 | Wu et al. | 455/234.1 |

FOREIGN PATENT DOCUMENTS

| | | |
|---|---|---|
| JP | 06-028771 | 2/1994 |
| JP | 08-164827 | 6/1996 |
| JP | 09-231341 | 9/1997 |
| JP | 10-161909 | 6/1998 |

* cited by examiner

*Primary Examiner* — Vivian Chin
*Assistant Examiner* — Fatimat O Olaniran
(74) *Attorney, Agent, or Firm* — Posz Law Group, PLC

(57) ABSTRACT

A sound signal generator includes a sound signal output function for outputting a sound signal to a command-driven amplifier that drives a speaker by using the sound signal being converted according to a control command, a first counter control function for changing a content of a first counter in a storage medium in a predetermined manner, a control command sending function for sending a control command to the command-driven amplifier upon having change in the content of the first counter in the predetermined manner, and a second counter control function for changing a content of a second counter in the storage medium in the predetermined manner upon having the control command sent to the command-driven amplifier by the control command sending function.

12 Claims, 4 Drawing Sheets

SOUND SIGNAL OUTPUT DEVICE AND PROGRAM FOR CONTROLLING SOUND OUTPUT

CROSS REFERENCE TO RELATED APPLICATION

This application is based on and claims the benefit of priority of Japanese patent application No. 2005-12902 filed on Jan. 20, 2005, the disclosure of which is incorporated herein by reference.

FIELD OF THE INVENTION

The present invention generally relates to a sound signal output device and a program for controlling the device.

BACKGROUND OF THE INVENTION

In recent years, a sound signal output device in a system such as a CD player, a DVD player, a radio, a TV or the like is widely used to output a sound signal to an amplifier. Then, the amplifier executes amplification process and the like for the sound signal before outputting the sound signal to a speaker or the like.

The sound signal output device outputs various control commands to the amplifier. For example, a navigation system with an audio-visual function transfers control commands such as a sound quality setting command, a mute command, a mute release command, and the like to the amplifier in a vehicle. Then, the amplifier, in response to these commands, executes process operations such as sound quality setting changes, muting of sounds, release of muting and the like upon receiving those commands. Further, the sound signal output device releases hardware mute for itself immediately before outputting the sound signal to the amplifier in some cases. For example, the navigation system keeps the hardware mute until sound source is switched from one source to the other so that a switching noise will not be transferred to the amplifier in an occasion that the navigation system begins to receive a radio program.

However, when a system having the sound signal output device in connection with the amplifier by wiring in a manner described above has a trouble that prevents sound output from the speaker, all components in the system has to be examined separately in order to tracked down a cause of the trouble.

SUMMARY OF THE INVENTION

In view of the above-described and other problems, the present invention provides a sound signal output device having a problem identification function. The problem identification function provides a practical measure for readily identifying a problem in a system having the sound signal output device as well as an amplifier and wiring when the system does not properly outputs sound.

The sound signal output device of the present invention uses a first counter in a storage medium for recording an output of a control command before outputting the control command, and uses a second counter in the storage medium for confirming the output of the control command after outputting the control command when the sound signal output device outputs the control command with a sound signal for controlling a speaker through a command driven amplifier upon receiving the sound signal. In this manner, the first and the second counters record and confirm the output of the control command in a corresponding manner when the output of the control command is normally executed. That is, for example, the correspondence of contents of the first and the second counters is kept when a system trouble occurred in a part other than a command output function of the sound signal output device, e.g. in the amplifier or the like. On the other hand, the correspondence of the contents of the two counters falls apart when a trouble prevents the output of the control command and related processes after the output of the control command.

Further, incremental or decremental step of the first and second counters may be the same value or may be a different value. The step value may be interpreted based on reference information for diagnosis or the like.

Furthermore, the first counter and the second counters may be used to "encase" the control signal from the sound signal. That is, the first counter and the second counter may be incremented/decremented immediately before and after the output of the control command. In this manner, existence of a trouble in the output of the control command can easily be detected by checking the correspondence of the contents of those counters.

Furthermore, the first and the second counters may be used to "encase" a release of muting control over the sound signal from the sound signal output device that succeeds the output of the control command. In this manner, existence of a trouble in either of the output of the control command and the release of the muting control can easily be detected by checking the correspondence of the contents of the counters.

Furthermore, a third and a fourth counters may be used to "encase" a second control command that controls the amplifier. That is, the third counter and the fourth counter may be incremented/decremented immediately before and after the output of the second control command. In this manner, a trouble in the second control command can easily be detected.

The sound signal output device of the present invention is also characterized by a second feature that involves incremental/decremental changes of the first and the second counters in the storage medium before and after a release of muting control over the output of the sound signal from the sound signal output device.

In this manner, the release of the muting control over the output of the sound signal can easily be verified by checking the correspondence of the contents of the first and the second counters. In other words, the correspondence of the contents of the first and the second counters breaks when the release of the muting control over the output of the sound signal has a trouble.

The correspondence of the first and the second counters may be checked by outputting the contents of those counters to an external device.

The sound signal output device of the present invention may be implemented as a program having relevant commands for controlling the output of the sound signal and incrementing the contents of the counters. That is, the program may have a sound signal output function, a first counter control function, a control command transfer function, and a second counter control function for controlling a computer as the sound signal control device. The program may further include a mute release function when the program is used to implement the second feature of the present invention.

BRIEF DESCRIPTION OF THE DRAWINGS

Other objects, features and advantages of the present invention will become more apparent from the following detailed description made with reference to the accompanying drawings, in which.

DETAILED DESCRIPTION OF THE PREFERRED EMBODIMENT

An embodiment of the present invention is described with reference to the drawings.

Figure 1:
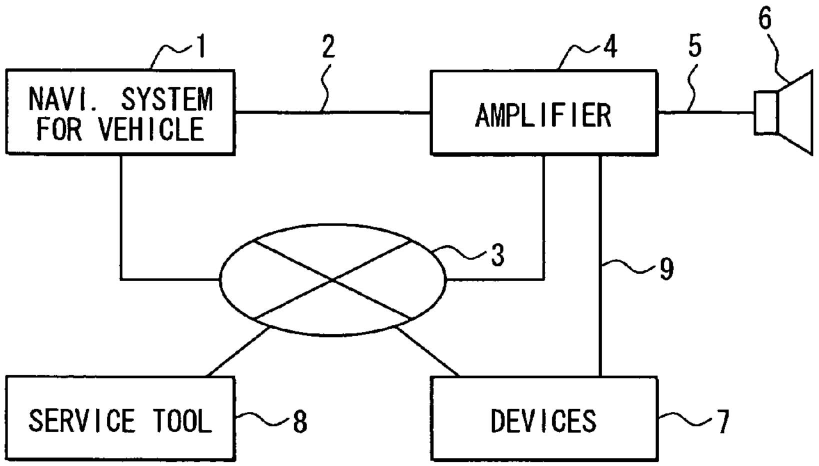
FIG. 1 shows a block diagram of an audio system in an embodiment of the present invention.

FIG. 1 shows a block diagram of an audio system in the embodiment. The audio system includes a navigation system 1 for a vehicle having an audio-visual function as well as an amplifier 4 connected thereto through a sound signal cable 2 and a vehicle LAN 3. The navigation system 1 outputs an analog sound signal to the amplifier 4 through the sound signal cable 2. The vehicle LAN 3 is a network such as a Controller Area Network (CAN) or the like. The LAN 3 interconnects the navigation system 1 and the amplifier 4 as well as devices 7 for use in the vehicle such as a CD player or the like that output the analog sound signal to the amplifier 4 through the sound signal cable 2. The LAN 3 accepts a service tool 8 for controlling other devices. The service tool 8 serves as a device that controls the other devices to send a predetermined signal as well as a device that receives and stores data in response to the predetermined signal.

The audio system in the vehicle uses a control command for controlling the navigation system 1 and the devices 7 through the vehicle LAN 3 to the amplifier 4. The control command includes data for requesting sound output right, sound quality (e.g., fade, balance, volume or the like) setting right, mute control, mute release control or the like. The amplifier 4 responds to one of plural requests for sound output right from various devices connected to the LAN 3 by sending response data for affirming the sound output right. Then, the amplifier 4 receives the sound signal from a device that got an affirmation response of the sound output right, and outputs the sound signal with an effect specified in a sound quality setting to a speaker 6. The amplifier 4 also responds to the mute control response and the mute release control response from the devices that received the affirmation response data respectively by conducting the mute control/mute release control for the speaker 6. The amplifier 4 ignores the requests from devices that received negation response from the amplifier 4.

Figure 2:
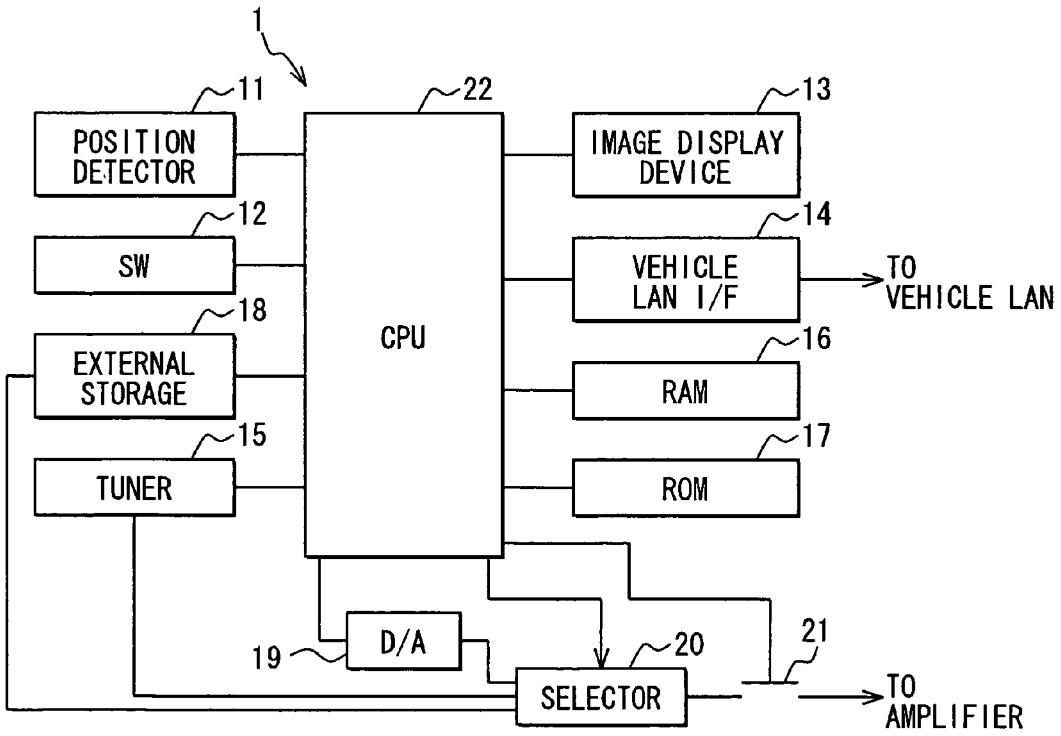
FIG. 2 shows a block diagram of a navigation system in the embodiment.

Structure and operation of the navigation system 1 in the audio system are described in detail in FIG. 2. The navigation system 1 includes a position detector 11, operation switches 12, an image display device 13, a vehicle LAN interface 14, a tuner 15, a RAM 16, a ROM 17, an external storage 18, a D/A converter 19, a selector 20, a ON/OFF switch 21, and a CPU 22.

The position detector 11 includes sensors (not shown in the figure) such as an earth magnetism sensor, a gyroscope, a speed sensor, a GPS receiver and the like. The operation switches 12 includes input devices such as a plurality of mechanical switches on the navigation system 1, a touch panel on a surface of the display of the image display device 13, and the like. The operation switches 12 are used for outputting signals to the CPU 22 based on a press on the mechanical switches and/or a touch on the touch panel. The image display device 13 displays an image based on an image signal outputted from the CPU 22.

The vehicle LAN interface 14 processes data received from the CPU 22 according to a communication protocol of the vehicle LAN 3, and outputs the data to the LAN 3 after processing. Further, the interface 14 receives the data sent by other devices to the navigation system 1 and converts the data into a format for recognition by the CPU 22 before outputting the data thereto.

The tuner 15 receives broadcasting signal of radio channels or TV channels based on a control signal from the CPU 22, and outputs a sound signal contained in the broadcasting signal to the selector 20.

The external storage 18 includes a drive for retrieving sound data and other data from a removable medium such as a DVD medium, a CD-ROM medium or the like. The storage 18 also includes a HDD (Hard disk drive). The storage 18 retrieves music data from the removable media for outputting sound signal of a music piece to the selector 20 (i.e., plays back a music piece) based on the control signal from the CPU 22. The HDD in the storage 18 stores programs to be executed in the CPU 22, map data to be used for route guidance, music data in a compressed form and the like.

The D/A converter 19 is a circuit that converts a digital sound signal from the CPU 22 to an analog sound signal before outputting it to the selector 20. The selector 20 is a circuit that outputs signals from either of the tuner 15, the external storage 18, and the D/A converter 19 to the ON/OFF switch 21 according to control by the CPU 22. The ON/OFF switch 21 switches ON and OFF of the output of the sound signal from the selector 20 to the amplifier 4 through the sound signal cable 4.

The CPU 22 executes the program retrieved from the ROM 17 and the external storage 18 for operating the navigation system 1 with information retrieved from the RAM 16, the ROM 17 and the external storage 18, and stores information in the RAM 16 and the external storage 18. The CPU exchanges signals with the position detector 11, the operation switches 12, the image display device 13 and the vehicle LAN interface 14.

The CPU 22 executes the programs, for example, for route search/guidance process when it receives an input of destination by a user from the operation switches 12. The CPU 22 calculates an optimum route from a current position detected by the position detector 11 to the destination, and displays the optimum route on a map in the image display device 13.

The CPU 22 plays back music pieces on demand. More practically, the CPU 22 controls the removable media such as the DVD medium, the CD-ROM medium or the like inserted in the external storage 18 for a playback of music pieces stored therein, or controls the tuner 15 for an output of sound from the radio channel or the TV channel, or controls the HDD in the external storage 18 for extracting the music data stored therein and outputting the extracted music data to the D/A converter 19.

Figure 3:
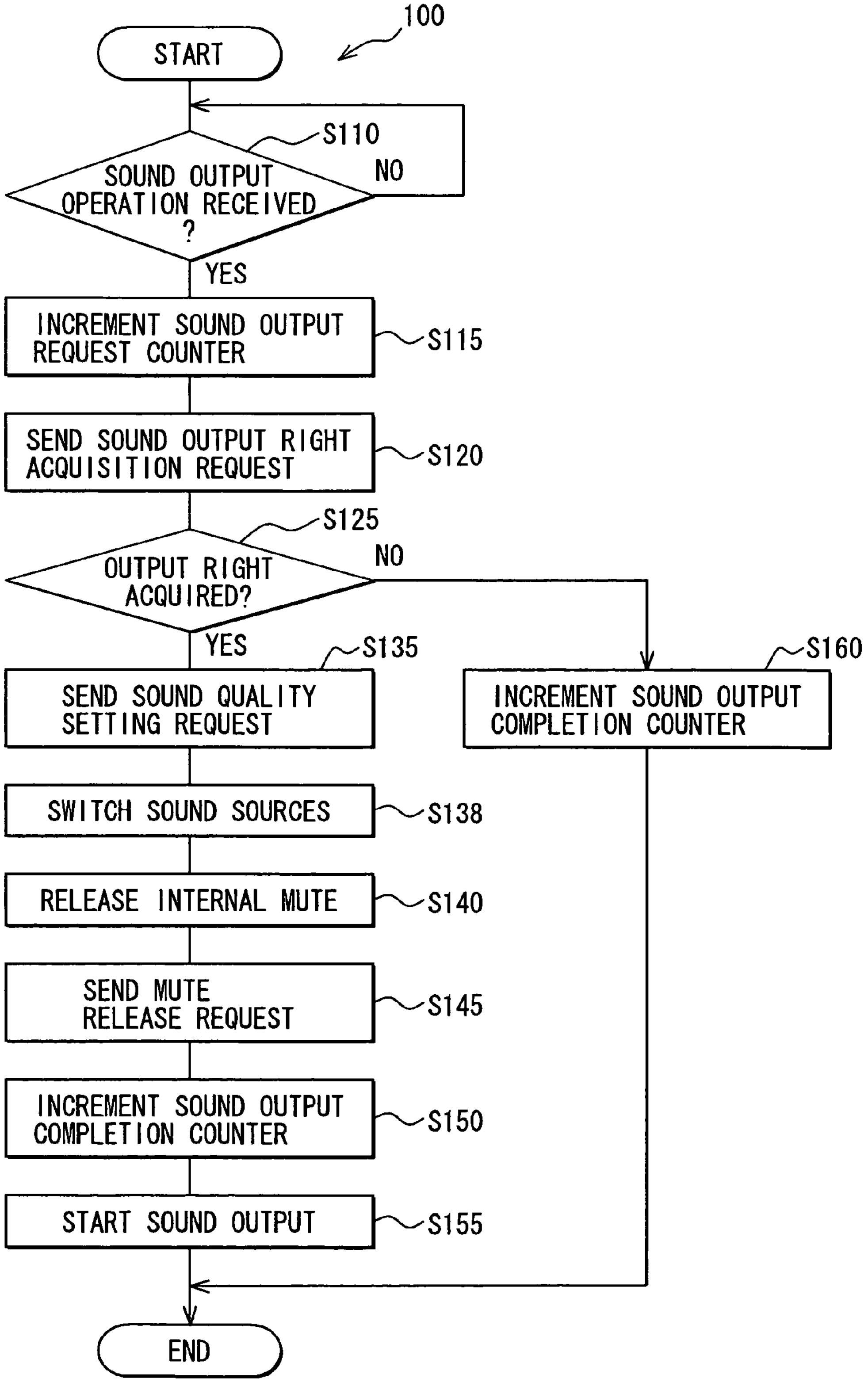
FIG. 3 shows a flowchart of a program for controlling a sound output process.

Further, the CPU 22 is always running a program 100 for controlling a sound output process shown as a flowchart in FIG. 3. Exchange of signals between the navigation system 1, the amplifier 4 and the speaker 6 is described in a signal chart in FIG. 4. The flowchart in FIG. 3 is explained with reference to the signal chart in FIG. 3.

The CPU 22 executes the program 100 for the sound output process in the following manner. That is, in step S110, the process waits for an input from the operation switches 12 by the user for a sound output operation. The process proceeds to step S115 when the user operates the switches 12 (corresponding to a process at timing 310 in FIG. 4). The sound output operation includes an operation for selecting a channel of the tuner 15, an operation for playing a DVD/CD-ROM medium inserted in the external storage 18, and an operation for playing the music data in the HDD in the storage 18.

Figure 4:
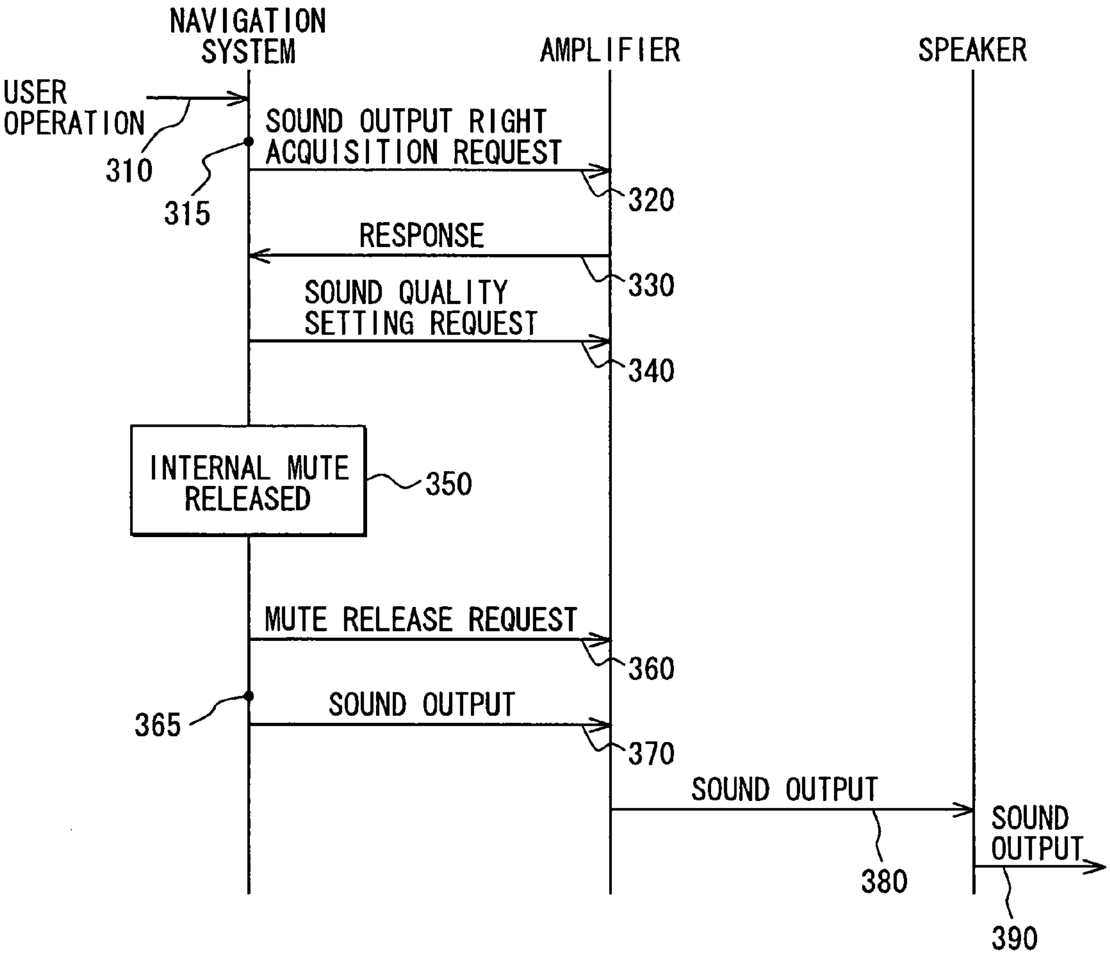
FIG. 4 shows a signal chart for describing exchange of signals between the navigation system, an amplifier, and a speaker.

In step S115, a sound output request counter implemented as data in the HDD of the external storage 18 is incremented by 1 (corresponding to a process at timing 315 in FIG. 4). The sound output request counter has an initial value of 0 when the navigation system 1 is shipped from a factory.

In step S120, a sound output right acquisition request 320 is sent to the amplifier 4. In step S125, a response 330 for the sound output right acquisition request 320 from the amplifier 4 is waited and received by the navigation system 1 for determining whether the response 330 indicates affirmation or negation of the sound output right acquisition. The process proceeds to step S135 when the response 330 is affirmative, and the process proceeds to step S160 when the response 330 is negative.

In step S135, a sound quality setting request 340 is sent to the amplifier 4. The ON/OFF switch 21 is turned off at this timing if the switch 21 is turned on. That is, the output of the sound from the selector 20 to the amplifier 4 is shut off in a hardware level.

In step S138, a source of the sound output is switched. More practically, one of three sound output sources, that is, the output of the sound signal from the tuner 15, the output of the sound signal from the external storage 18, and the output of the sound signal from the CPU 22 through the D/A converter 19 is selected by the selector 20 to be outputted to the ON/OFF switch 21 according to the sound output operation. Noise signal in this step in the selector 20 due to switching between the sound sources will not be outputted to the amplifier 4.

In step S140, the ON/OFF switch 21 is turned on for releasing internal muting (corresponding to a process 350 in FIG. 4).

In step S145, a mute release request 360 is sent to the amplifier 4.

In step S150, a sound output completion counter implemented as data in the HDD in the external storage 18 is incremented by 1 corresponding to a process at timing 365). The sound output completion counter has the initial value of 0 when the navigation system 1 is shipped from the factory.

In step S155, the output of the sound is started. More practically, the sound output process from a sound source specified in the sound output operation is started. In this manner, the navigation system 1 outputs a sound signal 370 to the amplifier 4, and the amplifier 4 outputs a sound signal 380 to the speaker 6 for an output of a sound 390 therefrom.

In step S160, the sound output completion counter is incremented by 1. The execution of the program 100 concludes after step S155 and step S160. In this case, there is no output of the control command from the navigation system 1 to the amplifier 4 nor the internal muting of the navigation system 1 between steps S110 and S120, between steps S150 and S155, nor between step S160 and conclusion of the program 100.

The program 100 controls the navigation system 1 to immediately increment the sound output request counter by 1 when the user inputs the sound output operation (step S110), and controls the system 1 to send the control command (the sound output right request, the sound quality setting request, the mute release request) to the amplifier 4 (steps S120, S135, S145) as well as to release the internal muting (step S140) and to increment the sound output completion counter by 1 before starting the output of the sound (step S155). When the response from the amplifier 4 is negative in terms of the output of the sound (step S125), the sound is not outputted and the sound output completion counter is incremented by 1 (step S150).

In this manner, the increment of the sound output request counter after the sound output operation by the user and the increment of the sound output completion counter before actually outputting the sound upon releasing the internal muting correspond with the control command encased therebetween. Therefore, the sound output request counter and the sound output completion counter take the same value after the increments of 1 as long as the control command in the navigation system 1 and the release of the internal muting are normally executed. For example, a trouble in the amplifier 4 or in a part other than the sound output command in the navigation system 1 do not affect the matching of the incremented value of those counters. However, when the control command for the sound output has a trouble and does not normally conclude, the value of the sound output completion counter fails to increment as the sound output request counter does. That is, the value of the sound output request counter becomes greater than that of the sound output completion counter.

Because of the situation described above, a service staff can readily determine whether a cause of the trouble exists in the control command of the sound output by checking the values of the sound output request counter and the sound output completion counter in the HDD of the external storage 18.

Figure 5:
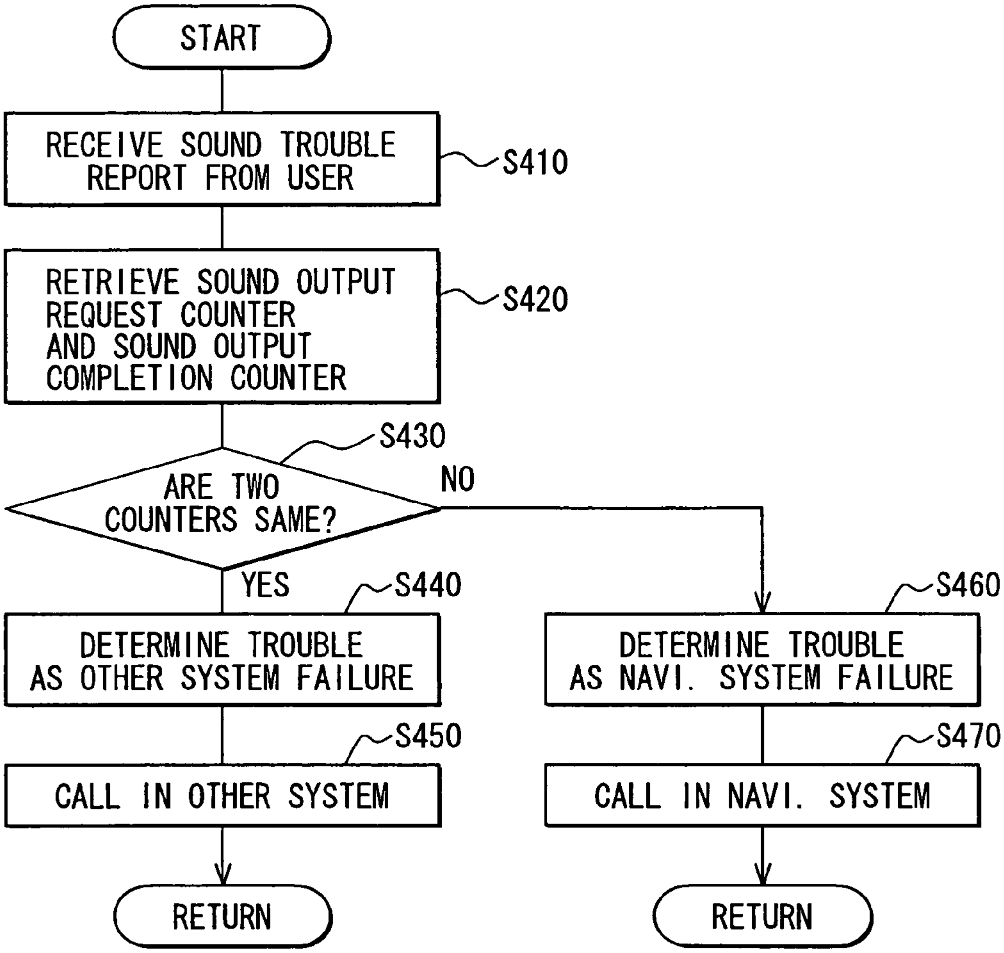
FIG. 5 shows a flowchart of a procedure for identifying a trouble in the audio system.
Figure 6:
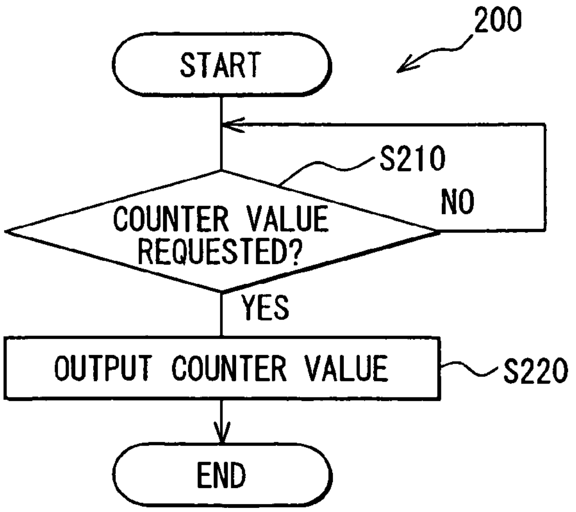
FIG. 6 shows a flowchart of another program for controlling a counter.

More practically, the service staff takes a process in a flowchart in FIG. 5 for determining the cause of the trouble. That is, the staff receives a call for service from the user in step S410. In step S420, the values of the sound output request counter and the sound output completion counter are retrieved. The value of the counter can be retrieved by sending data for a counter value request to the navigation system 1 from the service tool 8. The CPU 22 in the navigation system 1 is always running a program 200 in FIG. 6 for communication with the service tool 8. The program 200 executed in the CPU 22 waits for the counter value request from the service tool 8 through the vehicle LAN 3 in step S210, and outputs the values of the sound output request counter and the sound output completion counter in the HDD in the external storage 18 to the service tool 8 in step S220 when it receives the counter value request. The service tool 8 receives and displays these values for the service staff.

In step S430, the values of the two counters are compared with each other. In step S440, possibility of the navigation system failure is determined to be low when the two values are the same, and the service staff calls in and inspects other parts in the system before inspecting the navigation system 1 in step S450. On the other hand, in step S460, possibility of navigation system failure is determined to be high when the two counter values are different. That is, the navigation system 1 is determined to be having a trouble specifically in the control command for the sound output or in the release of the internal muting, and the service staff calls in the navigation system 1 for inspection before inspecting other parts.

Although the present invention has been fully described in connection with the preferred embodiment thereof with reference to the accompanying drawings, it is to be noted that various changes and modifications will become apparent to those skilled in the art.

For example, although the sound signal output device of the present invention takes a form of the navigation system 1 in the present embodiment, the sound signal output device may take a form of a music piece playback system for use in a house or the like. The sound signal output device may take a form of a portable music player.

Further, the navigation system 1 may not send the control command to the amplifier 4. The second characteristic of the present invention, i.e., verification of the release of the muting control, can be implemented only by incrementing the sound output request counter and the sound output completion counter before and after the muting control.

Furthermore, the navigation system 1 may not have the internal muting. That is, the primary characteristic of the present invention can be implemented without executing step S140 in the above embodiment.

Furthermore, the sound output request counter and the sound output completion counter may be stored in a rewritable medium such as an EEPROM or the like.

Furthermore, the counter used in step S150 and the counter used in step S160 may be different. That is, the counter in step S150 (counter A) may count a successful response for request for the sound output right, and the counter in step S160 (counter B) may count an unsuccessful response for the same request. In this case, the counter A in combination with the counter B serves as the sound output completion counter in the above embodiment.

Furthermore, the sound output request counter and the sound output completion counter may encase a single control command instead of a plurality of control commands and the release of the internal muting. In this manner, the content of these counters can be used to readily identify a trouble in a specific control command that is encased in these counters.

Furthermore, the navigation system 1 may not have the HDD in the external storage 18.

Furthermore, the sound signal output device may have plural sets of counters for encasing plural control commands. That is, a pair of the sound output request counter and the sound output completion counter may be duplicated for encasing plural control commands. For example, a pair of a request counter A and a completion counter A may be used before and after the request 320 in step S120 in the program 100, and a pair of a request counter B and a completion counter B may be used before and after the request 340 in step S135. In this manner, completion of plural control commands can be readily verified by checking the contents of the counters.

Such changes and modifications are to be understood as being within the scope of the present invention as defined by the appended claims.

What is claimed is:

1. A sound signal generator comprising:

a sound signal output means for outputting a sound signal to a command-driven amplifier that drives a speaker under control of a control command by using the sound signal;

a first counter control means for causing a predetermined change in a content of a problem-detecting first counter in a non-volatile storage medium and for storing a counter value of the problem-detecting first counter in the non-volatile storage medium;

a control command sending means for sending the control command to the command-driven amplifier after the predetermined change in the content of the problem-detecting first counter is caused by the first counter control means; and a second counter control means for causing a predetermined change in a content of a problem-detecting second counter in the non-volatile storage medium and for storing a counter value of the problem-detecting second counter in the non-volatile storage medium after the control command is sent to the command-driven amplifier by the control command sending means, wherein the counter values of the problem-detecting first counter and the problem-detecting second counter change in a corresponding manner as long as the control command is sent in a normal manner.

2. The sound signal generator according to claim 1, wherein the first counter control means causes the predetermined change in the content of the problem-detecting first counter prior to transmission of the control command to the command-driven amplifier when a user operation for sound output is given, and the sound signal output means starts an output of the sound signal to the command-driven amplifier prior to transmission of a succeeding control command to the command-driven amplifier when the control command is sent to the command-driven amplifier by the control command sending means.

3. The sound signal generator according to claim 2 further comprising:

a mute release means for releasing muting for the output of the sound signal toward other devices when the predetermined change in the content of the problem-detecting first counter is caused by the first counter controlling means, wherein the predetermined change in the content of the problem-detecting second counter is caused when muting for the output of the sound signal is released by the mute release means.

4. The sound signal generator according to claim 1 further comprising:

a third counter control means for causing a predetermined change in a content of a problem-detecting third counter in the storage medium;

a second control command sending means for sending a second control command to the command-driven amplifier when the predetermined change in the content of the problem-detecting third counter is caused by the third counter control means; and a fourth counter control means for causing a predetermined change in a content of a problem-detecting fourth counter in the storage medium when the second control command is sent to the command-driven amplifier by the second control command sending means.

5. A sound signal generator comprising:

a sound signal output means for outputting a sound signal to an amplifier that drives a speaker by receiving the sound signal;

a first counting means for causing a predetermined change in a problem-detecting first counter in a non-volatile storage medium and for storing a counter value of the problem-detecting first counter in the non-volatile storage medium;

a mute release means for releasing muting for the output of the sound signal toward other devices; and a second counting means for causing a predetermined change in a problem-detecting second counter in the non-volatile storage medium and for storing a counter value of the problem-detecting second counter in the non-volatile storage medium, wherein the mute release means releases muting for the output of the sound signal toward other devices when the predetermined change is caused in the problem-detecting first counter by the first counting means, and the mute-release means causes the predetermined change by the second counting means in the problem-detecting second counter by releasing muting for the output of the sound signal, and the counter values of the problem-detecting first counter and the problem-detecting second counter change in a corresponding manner as long as the releasing muting for the output of the sound signal occurs in a normal manner.

6. The sound signal generator according to claim 5 further comprising a counter content output means for outputting a content of the problem-detecting first counter and a content of the problem-detecting second counter in the storage medium.

7. A non-transitory computer-readable medium having computer program logic recorded thereon for enabling control of sound output comprising:

a sound signal output procedure for outputting a sound signal to a command-driven amplifier that drives a speaker under control of a control command by using the sound signal;

a first counter control procedure for causing a predetermined change in a content of a problem-detecting first counter in a non-volatile storage medium and for storing a counter value of the problem-detecting first counter in the non-volatile storage medium;

a control command sending procedure for sending a control command to the command-driven amplifier when the predetermined change in the content of the problem-detecting first counter is caused by the first counter control procedure; and a second counter control procedure for causing a predetermined change in a content of a problem-detecting second counter in the non-volatile storage medium and for storing a counter value of the second counter value of the problem-detecting second counter in the non-volatile storage medium when the control command is sent to the command-driven amplifier by the control command sending procedure, wherein the counter values of the problem-detecting first counter and the problem-detecting second counter change in a corresponding manner as long as the control command is sent in a normal manner.

8. A non-transitory computer-readable medium having computer program logic recorded thereon for enabling control of sound output comprising:

a sound signal output procedure for outputting a sound signal to an amplifier that drives a speaker by receiving the sound signal;

a first counting procedure for causing a predetermined change in a problem-detecting first counter in a non-volatile storage medium and for storing a counter value of the problem-detecting first counter in the non-volatile storage medium;

a mute release procedure for releasing muting for the output of the sound signal toward other devices; and a second counting procedure for causing a predetermined change in a problem-detecting second counter in the non-volatile storage medium and for storing a counter value of the problem-detecting second counter in the non-volatile storage medium, wherein the mute release procedure releases muting for the output of the sound signal toward other devices when the predetermined change is caused in the problem-detecting first counter, and the mute-release procedure causes the predetermined change in the problem-detecting second counter by releasing muting for the output of the sound signal, and the counter values of the problem-detecting first counter and the problem-detecting second counter change in a corresponding manner as long as the releasing muting for the output of the sound signal occurs in a normal manner.

9. The sound signal generator of claim 1, wherein the counter values of the problem-detecting first counter and the problem-detecting second counter do not change in a corresponding manner when the control command is not sent in a normal manner.

10. The sound signal generator of claim 5, wherein the counter values of the problem-detecting first counter and the problem-detecting second counter do not change in a corresponding manner when the releasing of the muting does not occur in a normal manner.

11. The sound signal generator of claim 7, wherein the counter values of the problem-detecting first counter and the problem-detecting second counter do not change in a corresponding manner when the control command is not sent in a normal manner.

12. The sound signal generator of claim 8, wherein the counter values of the problem-detecting first counter and the problem-detecting second counter do not change in a corresponding manner when the releasing of the muting does not occur in a normal manner.

* * * * *